United States Patent
Mirpuri

(10) Patent No.: US 11,875,988 B2
(45) Date of Patent: Jan. 16, 2024

(54) SUBSTRATE PAD AND DIE PILLAR DESIGN MODIFICATIONS TO ENABLE EXTREME FINE PITCH FLIP CHIP (FC) JOINTS

(71) Applicant: NXP USA, Inc., Austin, TX (US)

(72) Inventor: Kabir Mirpuri, Scottsdale, AZ (US)

(73) Assignee: NXP USA, INC., Austin, TX (US)

(*) Notice: Subject to any disclaimer, the term of this patent is extended or adjusted under 35 U.S.C. 154(b) by 181 days.

(21) Appl. No.: 17/244,354

(22) Filed: Apr. 29, 2021

(65) Prior Publication Data

US 2022/0352115 A1  Nov. 3, 2022

(51) Int. Cl.
*H01L 23/00* (2006.01)

(52) U.S. Cl.
CPC .............. *H01L 24/81* (2013.01); *H01L 24/13* (2013.01); *H01L 24/16* (2013.01); *H01L 2224/13011* (2013.01); *H01L 2224/13147* (2013.01); *H01L 2224/16227* (2013.01); *H01L 2224/81345* (2013.01); *H01L 2224/81359* (2013.01); *H01L 2224/81385* (2013.01); *H01L 2224/81455* (2013.01); *H01L 2224/81815* (2013.01)

(58) Field of Classification Search
CPC ......... H01L 24/81; H01L 24/13; H01L 24/16; H01L 2224/13011; H01L 2224/13147; H01L 2224/16227; H01L 2224/81345; H01L 2224/81359; H01L 2224/81385; H01L 2224/81455; H01L 2224/81815; H01L 23/49811; H01L 24/11; H01L 24/14; H01L 2224/0401; H01L 2224/11472; H01L 2224/11474; H01L 2224/11903; H01L 2224/13015; H01L 2224/13022; H01L 2224/13082; H01L 2224/1403; H01L 2224/1601; H01L 2224/16058; H01L 2224/16059; H01L 2224/1607; H01L 2224/16105; H01L 2224/16111; H01L 2224/16237; H01L 2224/17051
USPC ........................................................ 257/737
See application file for complete search history.

(56) References Cited

U.S. PATENT DOCUMENTS

| | | |
|---|---|---|
| 4,940,181 A | 7/1990 | Juskey, Jr. et al. |
| 5,056,216 A | 10/1991 | Madou et al. |
| 6,927,471 B2 | 8/2005 | Salmon et al. |
| 7,049,170 B2 | 5/2006 | Savastiouk et al. |
| 7,615,478 B2 | 11/2009 | Salmon |
| 8,424,748 B2 | 4/2013 | Hu |
| 9,159,670 B2 | 10/2015 | Kim et al. |
| 9,530,747 B2 | 12/2016 | Hu et al. |

(Continued)

*Primary Examiner* — Nduka E Ojeh
*Assistant Examiner* — Laura M Dykes

(57) ABSTRACT

An electronic component includes a device die and a substrate. The device die includes conductive contacts with conductive pillars conductively affixed to conductive contact. The conductive pillars include a cavity formed in an end of the conductive pillar opposite the conductive contact. The substrate includes of conductive pads that are each associated with one of the conductive contacts. The conductive pads include a conductive pad conductively affixed to the substrate, and a conductive ring situated within a cavity in the end conductive rings have a capillary formed along an axis of the conductive ring. A solder material fills the capillary of each of the conductive rings and the cavity formed in the end of the associated conductive pillars to form a conductive joint between the pillars and the conductive pads.

15 Claims, 11 Drawing Sheets

(56) References Cited

U.S. PATENT DOCUMENTS

2004/0251527 A1* 12/2004 Van Puymbroeck ... H01L 23/13
                                                                                        257/678
2012/0012998 A1*  1/2012  Chandrasekaran ........................
                                                                                    H01L 23/49816
                                                                                      257/E21.507
2013/0146872 A1*  6/2013  Chen ....................... H01L 24/10
                                                                                      257/E23.01

\* cited by examiner

SUBSTRATE PAD AND DIE PILLAR DESIGN MODIFICATIONS TO ENABLE EXTREME FINE PITCH FLIP CHIP (FC) JOINTS

FIELD OF THE DISCLOSURE

This disclosure generally relates to electronic components, and more particularly relates to substrate pad and die pillar design in flip chip (FC) joints in electronic components.

BACKGROUND

An electronic device is typically assembled from various components that are attached to a printed circuit board (PCB). The PCB typically includes metallic traces that provide connections between the various components to power the components and to carry electrical signals between the various components. The various components may include discrete circuit elements, such as resistors, capacitors, inductors, and the like, and packaged integrated circuits. The various components can be soldered to the PCB or can be installed into complimentary connectors that are themselves typically soldered to the PCB. A common method for incorporating an integrated circuits (IC) into an electronic device is to first assemble the integrated circuit onto a substrate to form a completed assembly, referred to herein as a flip chip (FC) component. Then the FC component is installed onto the electronic device, for example by soldering the FC component onto the PCB.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures.

It has been understood by the inventor of the current disclosure that the increasing functionality of ICs used in an electronic device necessitates increases in the number of power and signal connections that need to be routed to a PCB of the electronic device. However, given connectors between an IC die and the associated substrate of a FC component, the size and shape of the conductive pads on the IC and the substrate are too large to reasonably accommodate the increased signal density. However, making the conductive pads on the die and the substrate smaller by narrowing the diameter of the pads results in problems with the reliability of the solder joints between the conductive pads due to the decreased amount of solder that can be accommodated within the FC joint. In particular, increasing the amount of solder deposited on the pads may result in bridging between connections, while decreasing the amount of solder may lead to solder joints that have lower resistance to failure.

Figure 1:
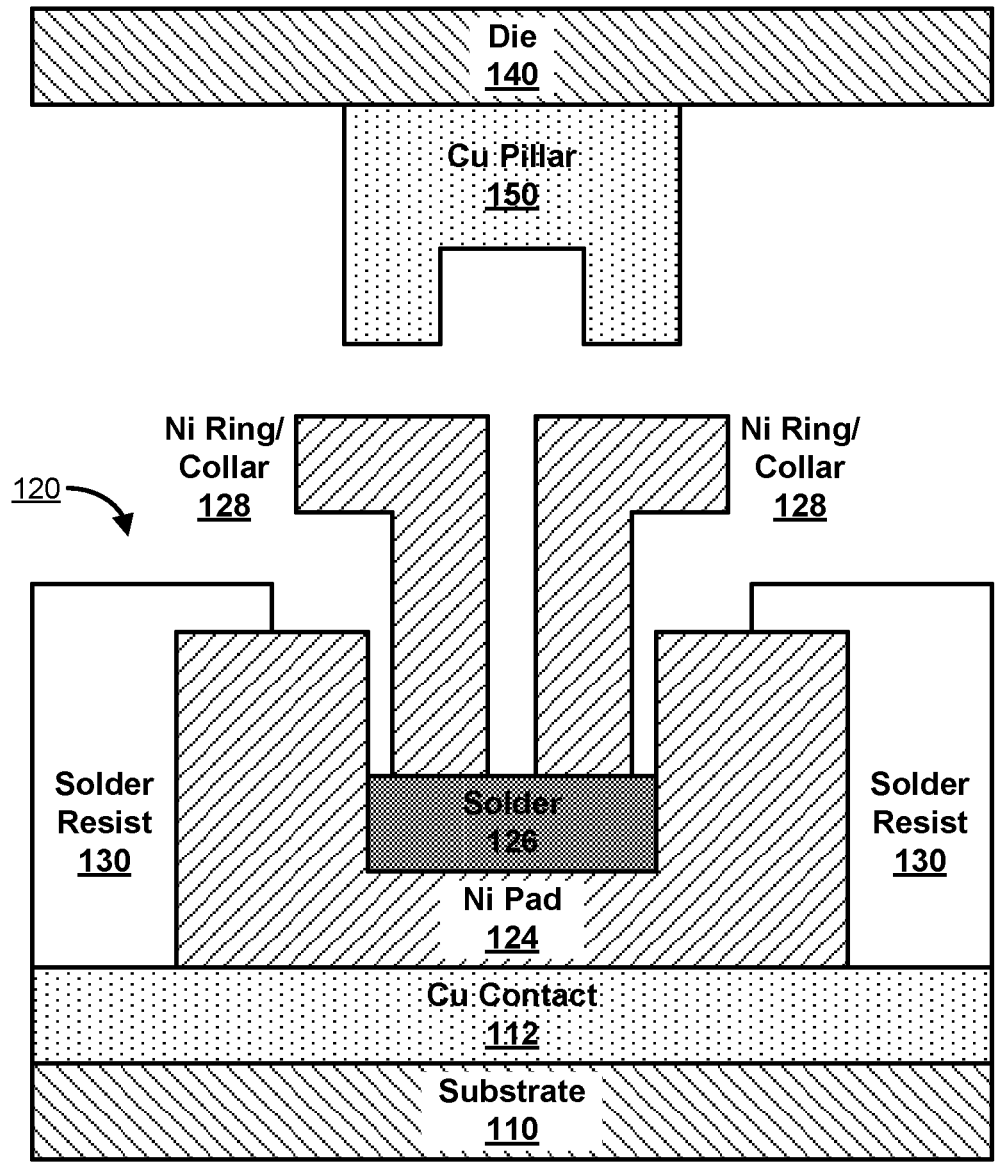
FIG. 1 is a diagram illustrating a conductive connector structure having an unmade connection between an IC die and a substrate of a FC component according to an embodiment of the current disclosure.

FIG. 1 illustrates a conductive connector structure 100 having an unmade connection between of a substrate 110 and an electronic device die 140, which, when assembled together, form a FC component. Substrate 110 includes a copper contact 112 and a conductive contact 120. Copper contact 112 is formed on the top surface of substrate 110 and conductive contact 120 is formed on a top surface of the copper contact. Conductive contact 120 includes a nickel pad 124, solder 126, and a nickel ring/collar 128. Nickel pad 124 is formed on the top surface of copper contact 112. Nickel pad 124 has a cavity into which is deposited solder 126, and nickel ring/collar 128 is formed atop solder 126. A photo imageable solder resist 130 is provided around conductive contact 120 to prevent solder 126 from flowing outside of a predefined region of the final connection. Die 140 includes a copper pillar 150. Copper pillar 150 is formed on a conductive contact (not illustrated) on an active side (i.e., a major side having circuitry) of die 140. A first end of copper pillar 150 is affixed to a conductive contact (not illustrated) of die 140, and a cavity is formed in a second end of the copper pillar.

Figure 2:
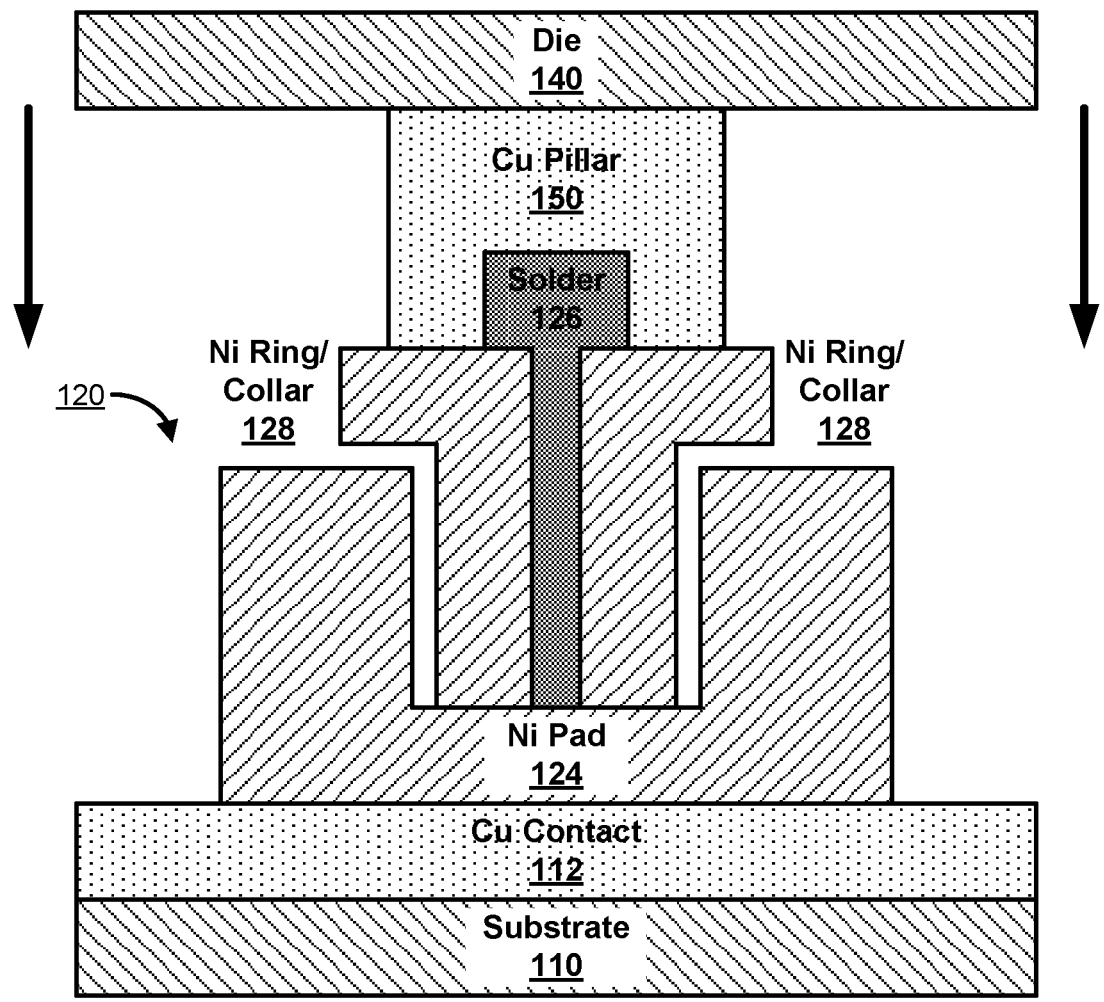
FIG. 2 is a diagram illustrating the conductive connector structure of FIG. 1 having a made connection between the IC die and the substrate.

FIG. 2 illustrates conductive connector structure 100 having a made connection between substrate 110 and die 140. Here, die 140 is lowered toward substrate 110 such that copper pillar 150 comes into physical contact with nickel ring/collar 128. The assembly is heated to a temperature sufficient to melt solder 126. The melt flows up a capillary formed in nickel ring/collar 128 to fill the cavity in the end of copper pillar 150. The assembly is cooled to permit the solder to solidify, and a conductive connection is thereby made between die 150 and substrate 110. In particular, the connection between copper pillar 150 and nickel ring/collar 128 operates to increase the volume of solder in the connection interface by depositing solder within the cavity in the end of the copper pillar. Here, nickel ring/collar 128 acts as a piston to push solder 126 through the capillary in the nickel ring/collar. Here, the volume of solder 126 can be controlled by fabricating a deeper or wider cavity in nickel pad 124. In another embodiment, a greater volume of solder can be applied at the connection interface by filling the cavity in copper pillar 150. Further, because solder 126 is extruded into the cavity in copper pillar based upon the contact of the copper pillar with nickel ring/collar 128, the reflowing solder is substantially contained and is not free to flow out and around the outside of the connection interface, and the likelihood of bridging between contacts is greatly reduced. Note that in the illustrated connection, nickel ring/collar 128 is pushed all the way into the cavity of nickel pad 124, leaving no solder, or nearly no solder, in the cavity, but this is not necessarily so. In a particular embodiment, nickel ring/collar 128 is fabricated with a shorter length, such that the collar, when fully pressed into the cavity, comes into contact with the top surface of nickel pad 126, and the bottom of the nickel ring/collar remains above the bottom surface of the cavity, such that there remains a small amount of solder in the cavity, as needed or desired. In a particular embodiment, the made connection between substrate 110 and die 140 is formed via a thermal conductive bonding process such as thermocompression bonding (TCB) or the like, as may be known in the art.

Figure 3:
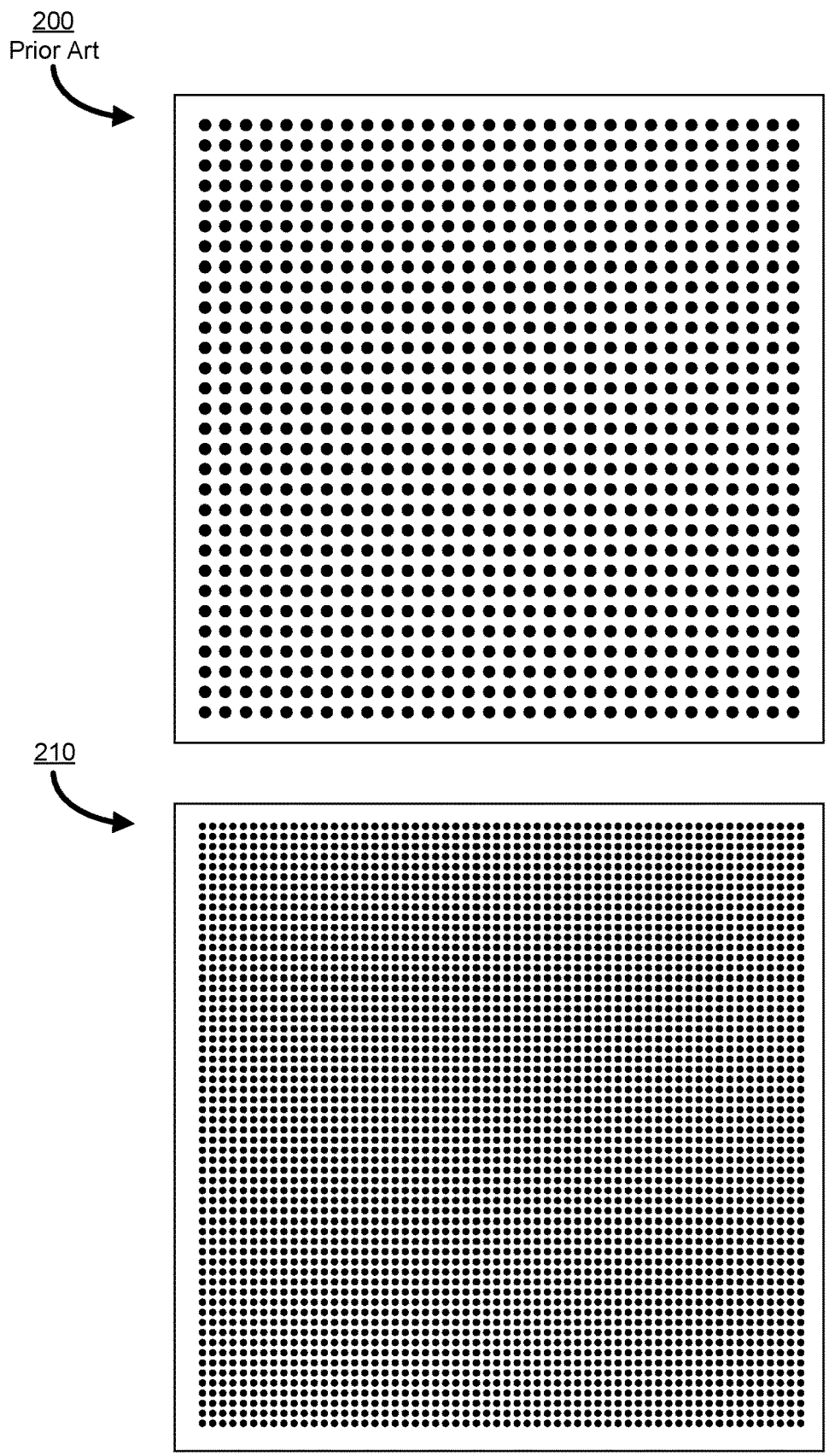
FIG. 3 illustrates connection arrays of a substrate and die of a flip chip component according to an embodiment of the current disclosure.

FIG. 3 illustrates connection arrays 200 and 210. Connection arrays 200 and 210 represent all of the connections between a die and its associated substrate. Connection array 200 represents a prior art connection array fashioned in a 30×30 grid of 900 connections. In the current embodiments, because the connection interface is more securely maintained between the copper pillars and the nickel ring/collars, and because the likelihood of bridging is greatly reduced, the structures making up the conductive contacts and the copper pillars can be greatly reduced in size, and a substantially greater number of connections can be made to fit on the surfaces of a die and a substrate. Here, connection array 210 represent a connection array in accordance with the current embodiments, where connection array 210 is fashioned in a 120×120 grid of 14400 connections. As will be described below, the connection pads on a substrate and the copper pillars on a die are formed by a lithography process. For example, utilizing a lithography process may permit copper pillar and conductive contact diameters in the range of 1-3 micrometers (μm) as opposed to the ~20 μm copper pillar diameters in the prior art, permitting up to 100 time more contacts per unit die area, or more. Moreover, copper pillars and conductive contacts with diameters in the range of a few to several hundreds of nanometers (nm) may be fabricated. For example copper pillars on a die and conductive contacts on a substrate may be provided with diameters in the range of 10-100 nm, as needed or desired, permitting an even greater number of connections.

Figure 4:
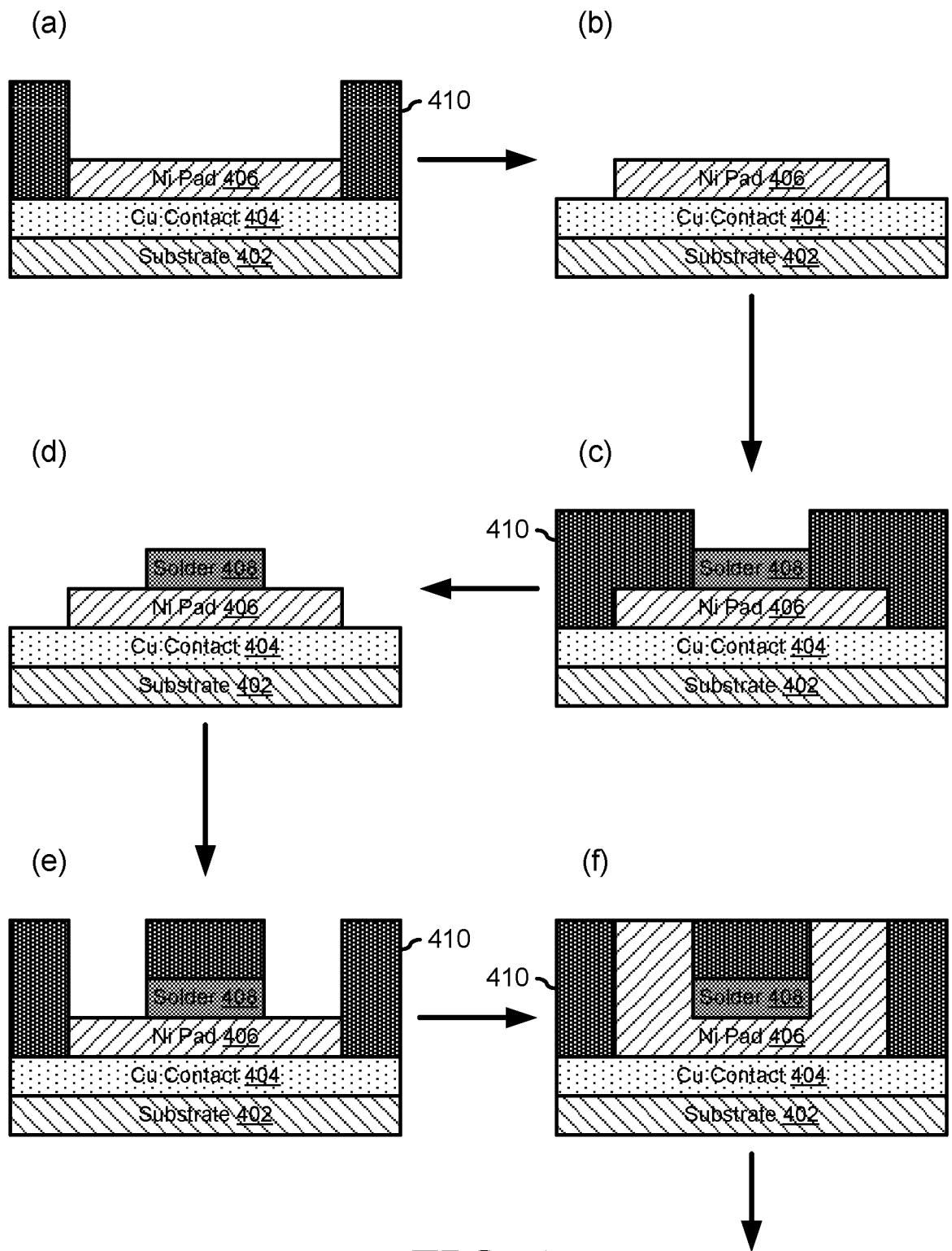
FIGS. 4-6 illustrate a fabrication process for forming a conductive pad on a substrate according to an embodiment of the current disclosure.
Figure 5:
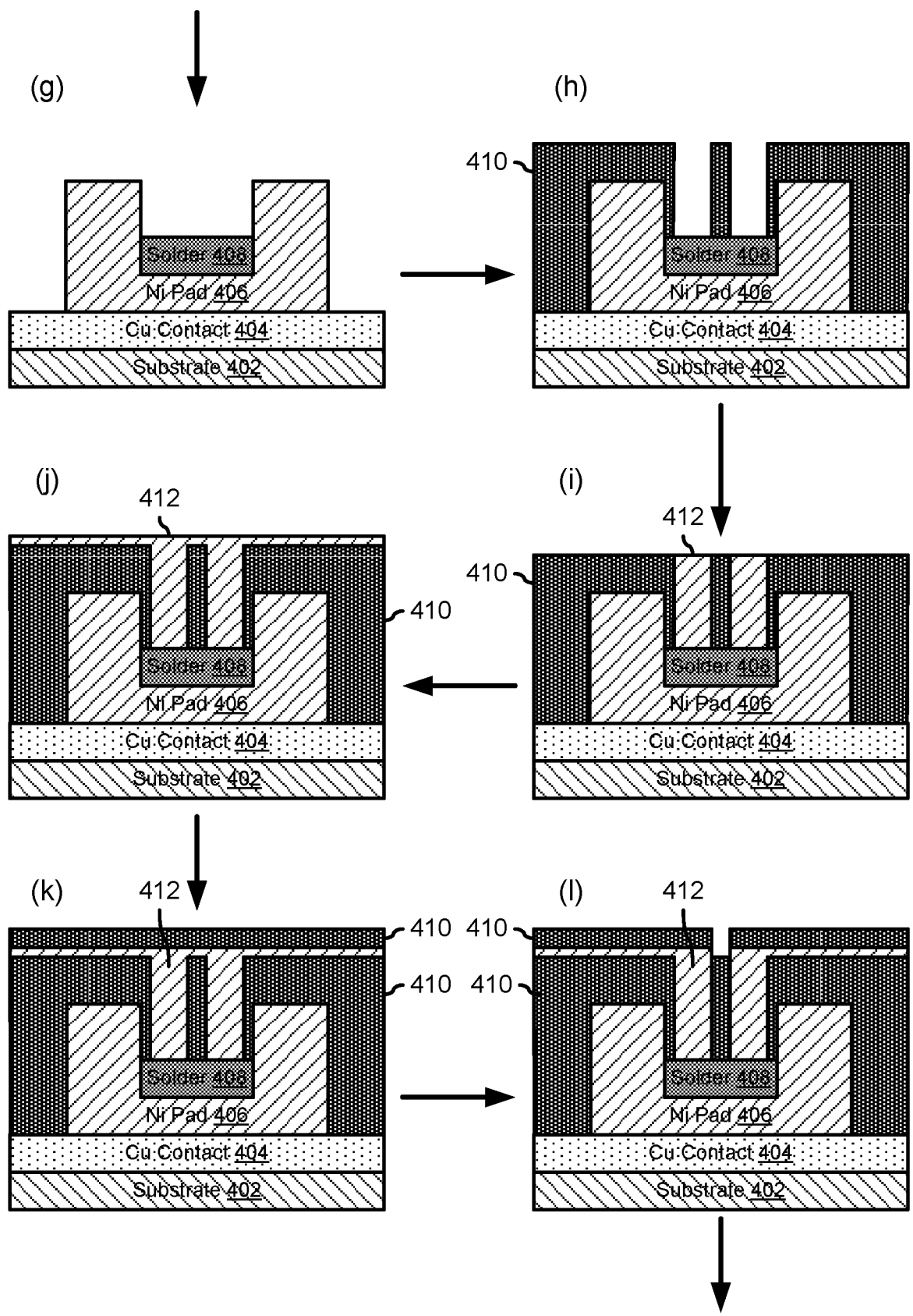
Figure 6:
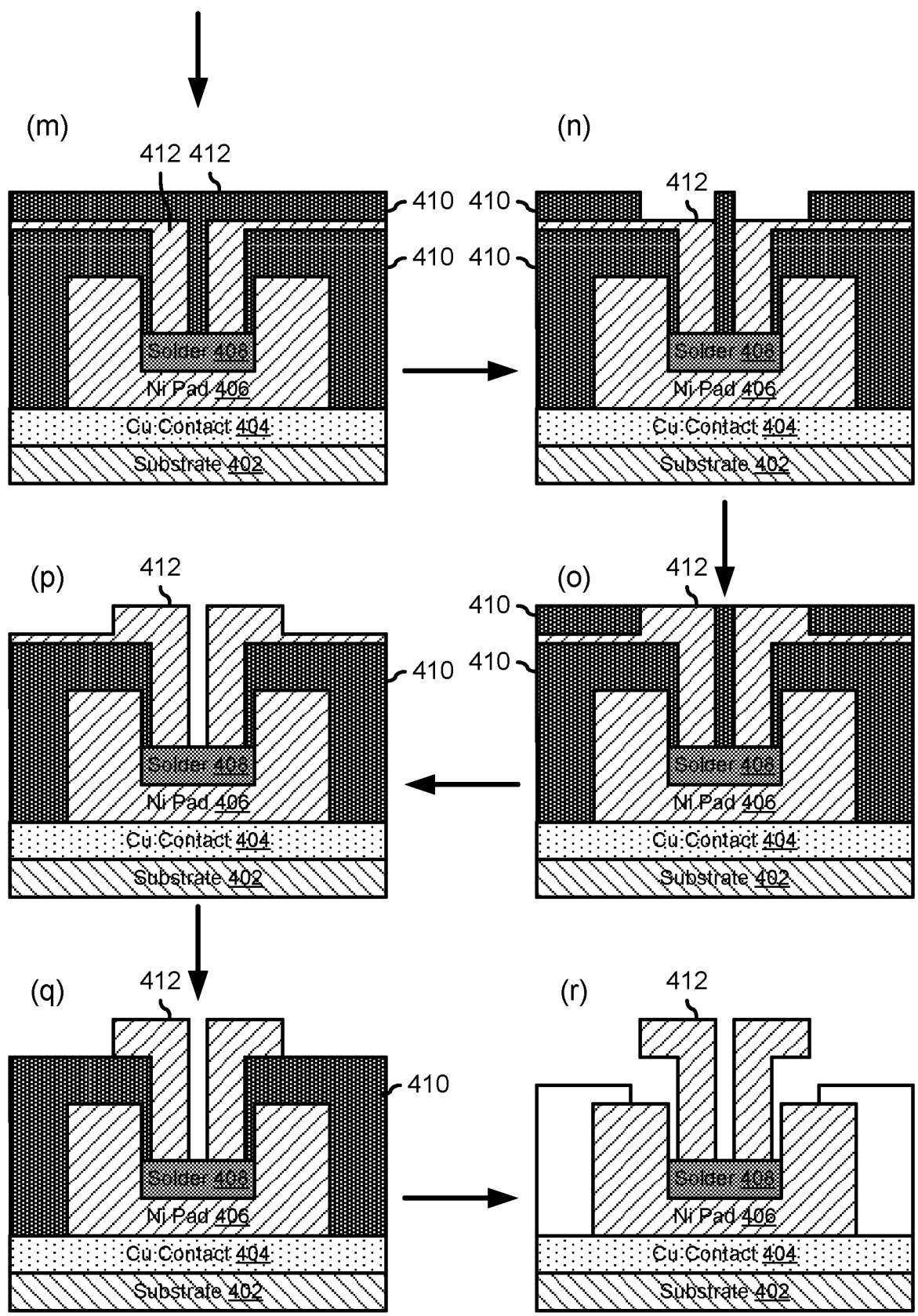

FIGS. 4-6 illustrate a fabrication process for forming a conductive contact on a substrate. In a beginning step (a), a copper contact 404 has previously been formed on a substrate 402, as may be known in the art. A photoresist 410 is patterned and nickel is deposited on the exposed copper 404 to form a nickel pad base 406. Note that in FIGS. 4-6 and 7, a photoresist is shown as a dark region. In step (b), the photoresist is stripped, leaving the nickel pad base 406. In step (c), photoresist 410 is again patterned and solder 408 is deposited on the exposed nickel pad base 406. In step (d), the photoresist is stripped leaving the nickel pad base 406 and the solder 408. In step (e), photoresist 410 is patterned to create a cavity around the solder 408. In step (f), nickel is deposited on the exposed nickel pad base to form the side wall of the nickel pad 406, thereby completing the nickel pad 406. In step (g), the photoresist is stripped, leaving the completed nickel pad 406 with the solder 408 in the cavity of the nickel pad 406. In step (h), photoresist 410 is patterned to cover the nickel pad 406 and to create a pillar in the middle of the solder 408 to form the capillary in the yet to be formed nickel ring/collar. In step (i), nickel is deposited onto the exposed solder to form the nickel ring 412, and a nickel seed layer is deposited on the surface of the photoresist in step (j). In step (k), a thin layer of photoresist 410 is deposited. In step (1), the top layer of photoresist 410 is patterned in line with the capillary formed in the nickel ring 412, and the nickel seed layer over the capillary is etched away. In step (m), photoresist 410 is deposited, in step (n), the photoresist 410 is patterned to form the top collar of the nickel ring/collar 412, and in step (o), nickel is deposited over the exposed nickel overburden to form the top collar 412. In step (p), the photoresist is stripped, and in step (q), the nickel seed layer is etched, leaving the completed nickel ring/collar 412 atop the solder 408. In step (r), any remaining photoresist is stripped, and solder mask is deposited around the conductive contact to complete the conductive contact as shown in FIGS. 1 and 2. Note that in step (h), the photoresist 410 is formed on the inside surface of the nickel pad 406. In this way, the nickel conductive ring/collar 412 formed in the process is isolated from the nickel pad 406 such that no bond forms between the nickel pad 406 and the nickel ring/collar 412, leaving the nickel ring/collar 412 free to move within the cavity of the nickel pad 406 when the solder 408 is reflowed. Here, the gap separating the nickel pad 406 and the nickel ring/collar 412 may be adjusted to a desired width. For example, it may be desirable for a portion of the solder 408 to reflow into the gap and so a wider gap may be desired, or it may be desirable for a minimum amount of solder 408 to reflow into the gap and so a narrower gap may be desired. It will be further understood that the amount of solder deposited in step (c) may be adjusted in accordance with the desired gap.

Figure 7:
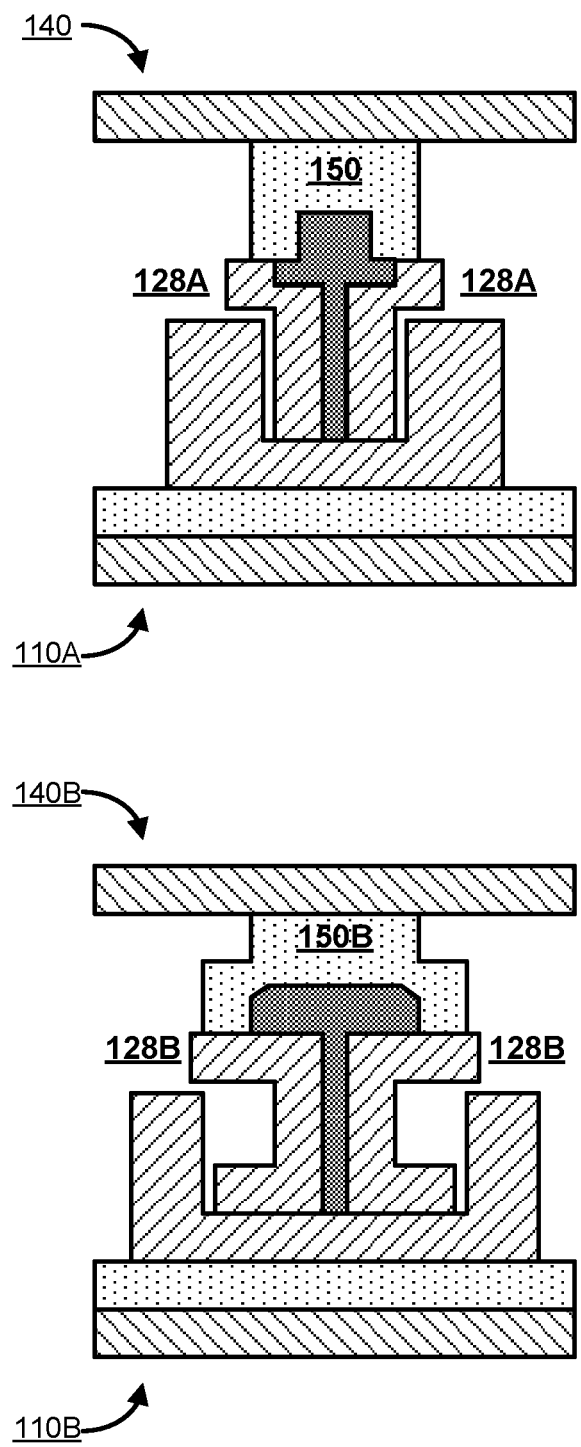
FIG. 7 illustrates various embodiments of made connections between a substrate and a die 140 according to an embodiment of the current disclosure.

FIG. 7 illustrates various embodiments of made connections between substrate 110 and die 140. In a first embodiment, die 140, and hence copper pillar 150, are unchanged from the embodiment shown in FIGS. 1 and 2. However substrate 110A as illustrated has a modified nickel ring/collar 128A. Here, nickel ring/collar 128A includes a cavity fabricated into the top surface of the collar to permit a greater volume of solder in the area of the made connection, and increasing the surface area of the soldered connection. In a second embodiment, die 140B has a modified copper pillar 150B, and substrate 110B has a modified nickel ring/collar 128B. In particular, copper pillar 150 has a broadened profile at the end of the pillar to permit a wider cavity, and nickel ring/collar 128B has a broadened collar profile to accommodate the broadened profile of the copper pillar to permit a greater volume of solder in the area of the made connection, and increasing the surface area of the soldered connection.

Figure 8:
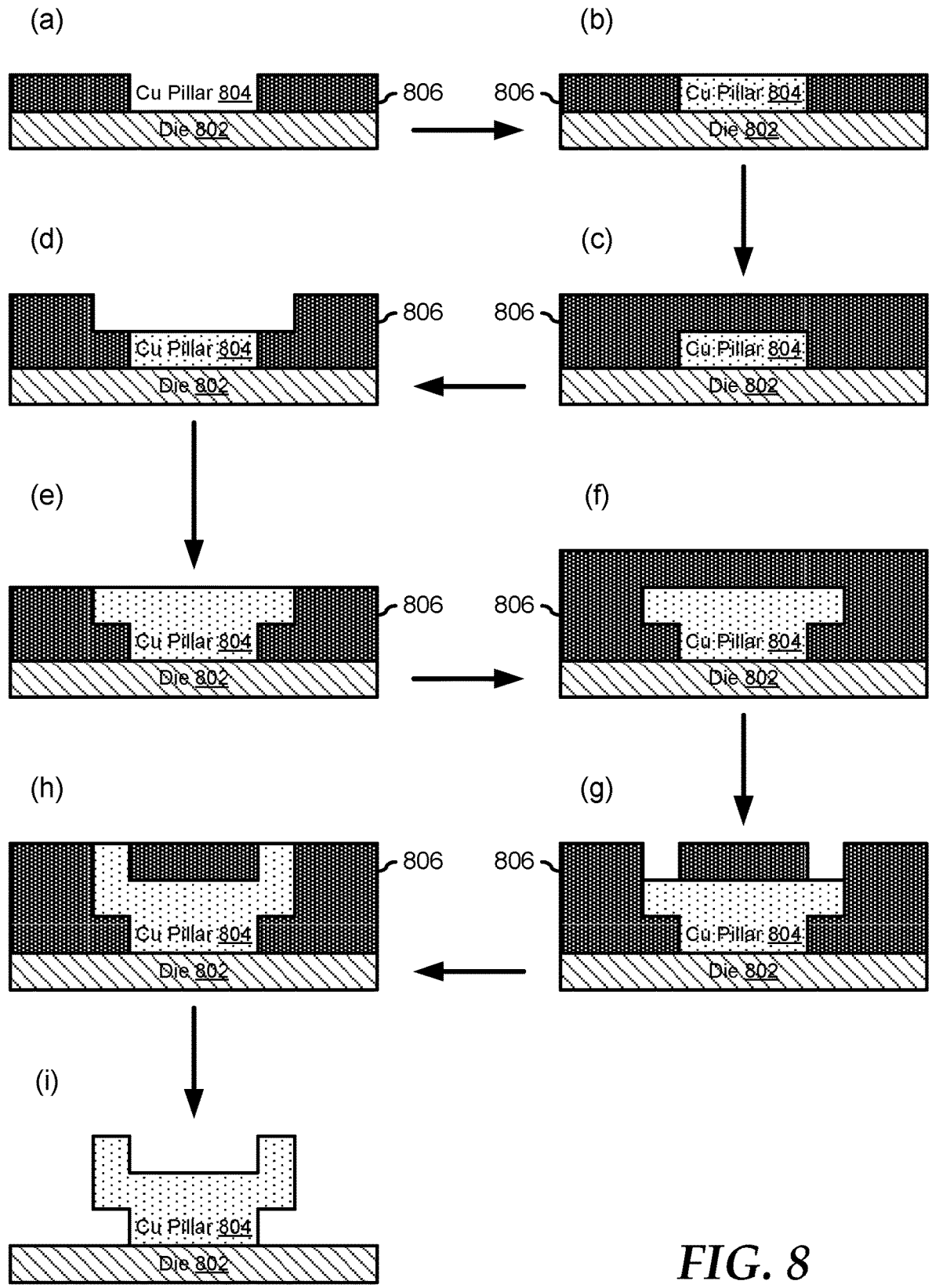
FIG. 8 illustrates a fabrication process for forming a copper pillar on a die according to an embodiment of the current disclosure.

FIG. 8 illustrates a fabrication process for forming a copper pillar similar to copper pillar 128B on a die. In step (a), a photoresist 806 is patterned on a die 802 to form the base of a copper pillar 804 on the surface of the die, and in step (b) the copper base 804 is deposited into the patterned area. In step (c), photoresist 806 is deposited, in step (d), the photoresist 806 is patterned, and, in step (e), copper is deposited on to the copper base to form the base of the broadened profile of the pillar 804. In step (f), photoresist 806 is deposited, in step (g), the photoresist 806 is patterned, and, in step (h), copper is deposited on to the broadened base to form the wall of the broadened profile of the pillar 804. The photoresist is scrubbed in step (i), leaving the completed copper pillar 804.

Figure 9:
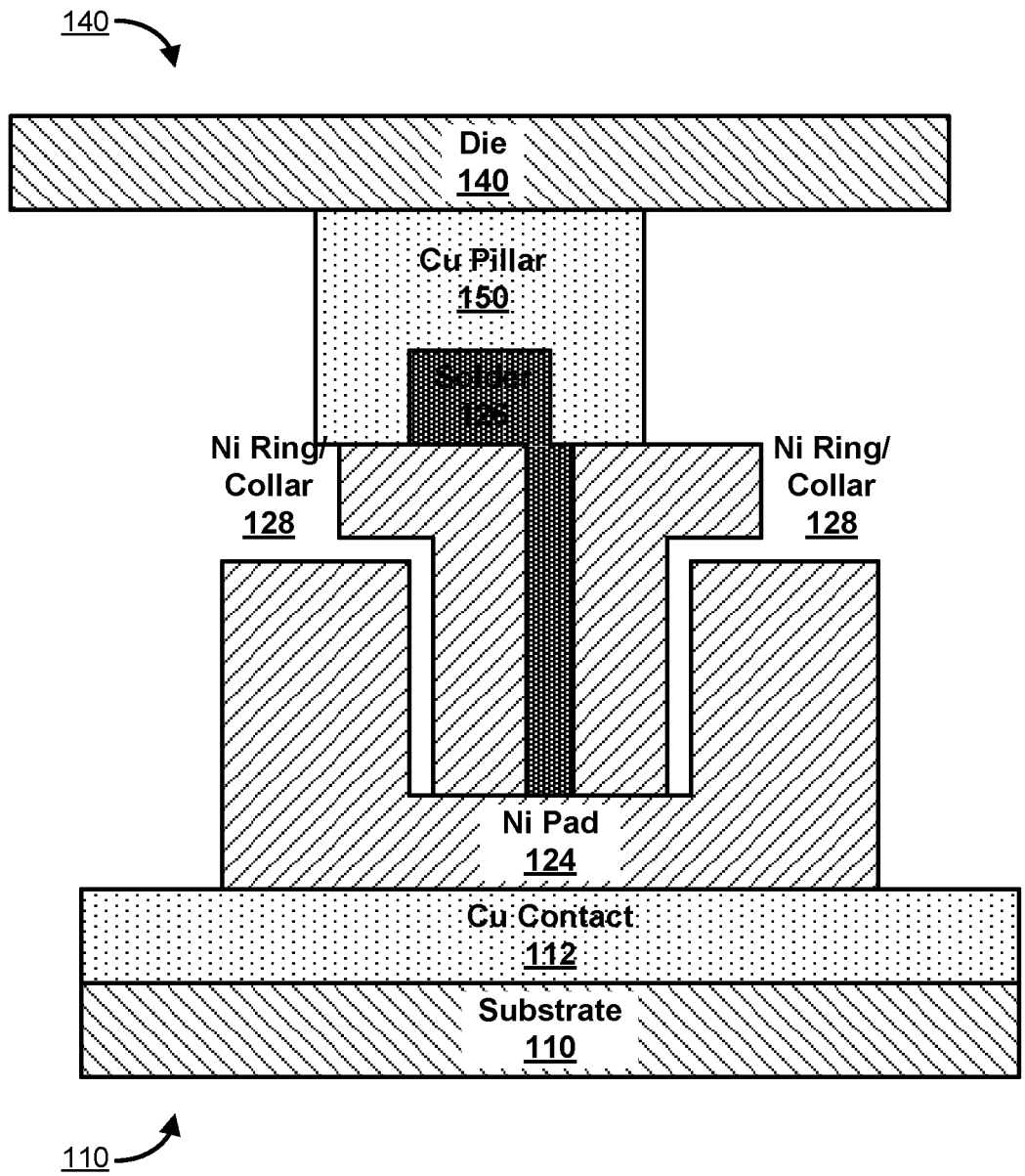
FIGS. 9 and 10 illustrate made connections between a substrate and die a, where the substrate and the die exhibit varying degrees of misalignment according to an embodiment of the current disclosure.
Figure 10:
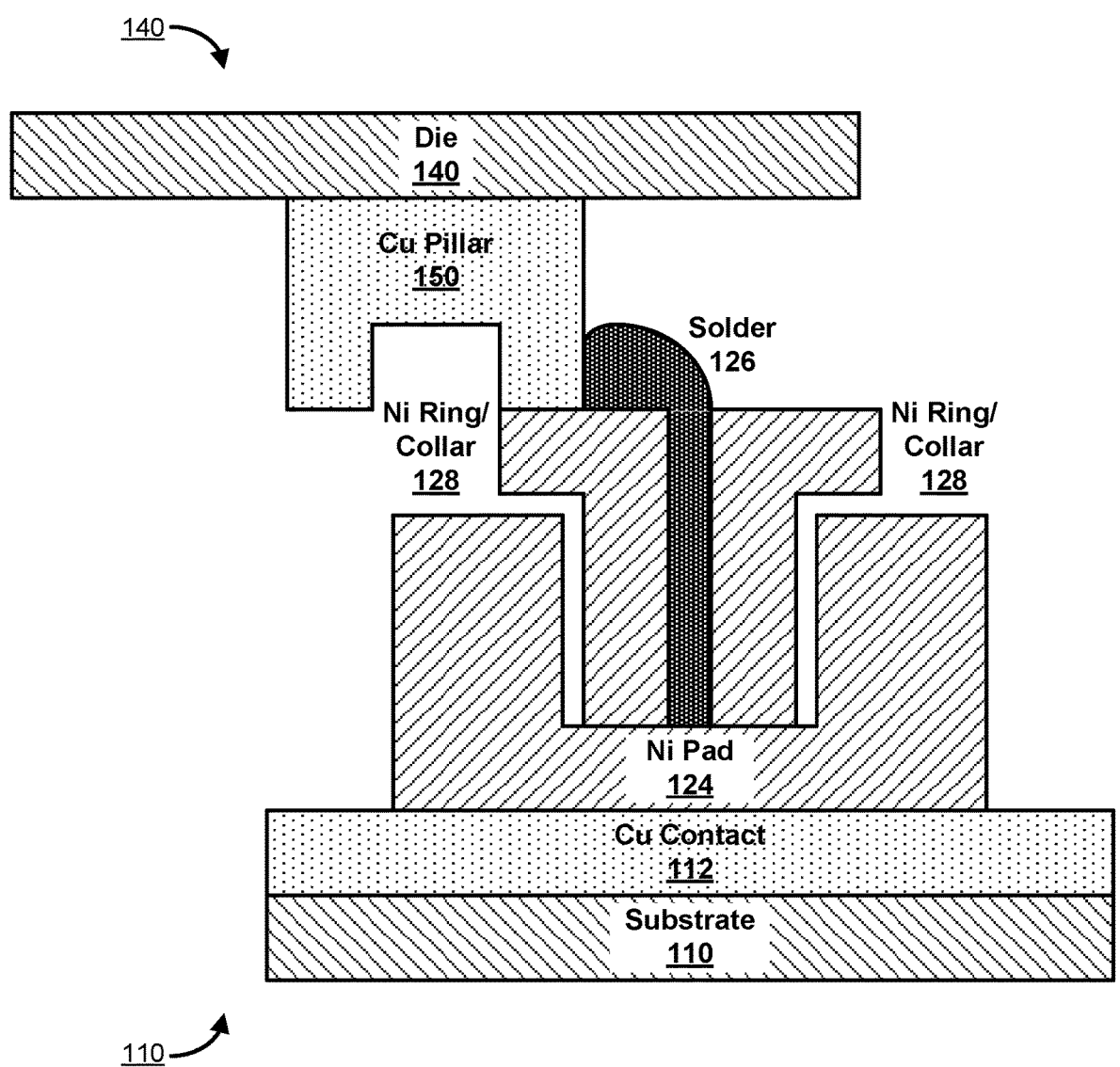

FIGS. 9 and 10 illustrate the made connection between substrate 110 and die 140, where the substrate and the die exhibit varying degrees of misalignment. In FIG. 9, die 140 is slightly misaligned with substrate 110. Here, when die 140 is lowered toward substrate 110, the misalignment is such that solder 126 still fills the cavity in the end of pillar 150. Here, the degree of misalignment that is tolerable with the current embodiments will be understood to be adjustable based upon the profiles of the associated copper pillars and conductive contacts, and particularly of the nickel ring/collars.

In FIG. 10, die 140 is misaligned with substrate 110 such that the cavity is not filled at all. For example, the inventor of the current disclosure has understood that, where a typical die may have dimensions of 8 millimeters (mm) by 9 mm (8×9 $mm^2$), and may be expected in the assembly of the flip chip component to experience a misalignment of ~1-2 Here, with copper pillars and conductive contacts fabricated with sub-micrometer diameters, misalignments as illustrated in FIG. 10 may be experienced. However, here, solder 126 will still be expected to tend to reflow toward the copper pillar, and away from any adjacent misaligned connections. Thus the current embodiments provide additional tolerance for misalignments.

Figure 11:
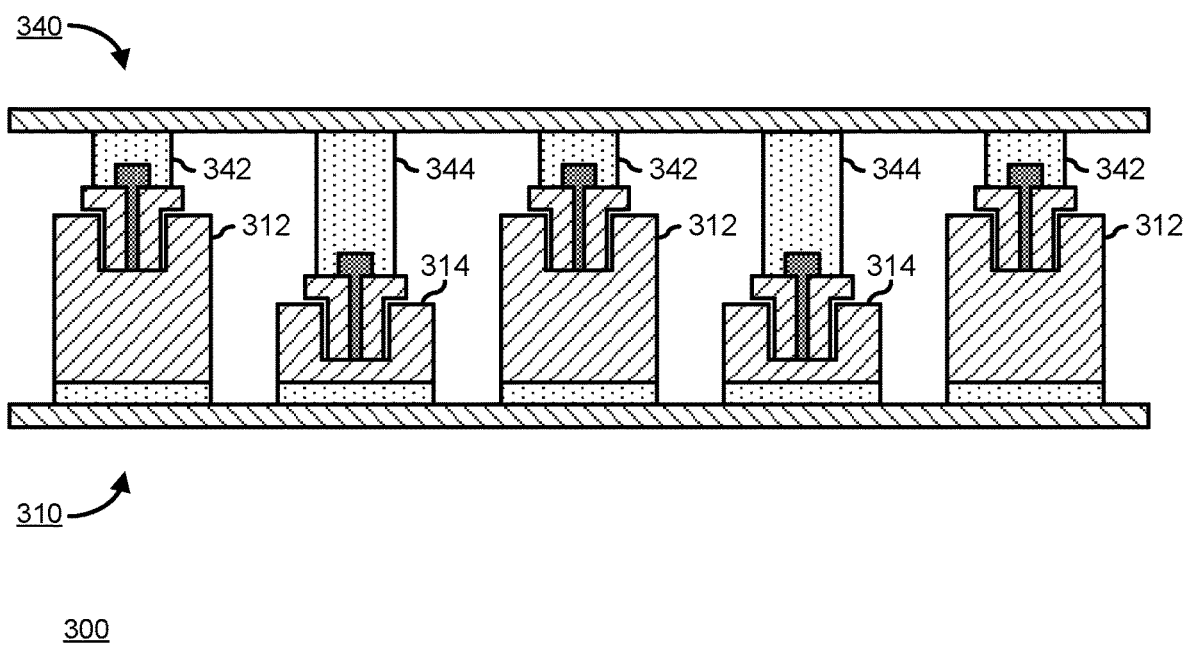
FIG. 11 illustrates an arrangement of connections between a substrate and a die according to an embodiment of the current disclosure.

FIG. 11 illustrates an arrangement 300 of connections between a substrate 310 and a die 340. Here, the overall height of the connections remains constant, but the heights of the components of each adjacent connection is varied, with one connection having a taller conductive contact 312 and a correspondingly shorter pillar 342, and the adjacent connector having a shorter conductive contact 314 and a correspondingly taller pillar 344. In this way, any extruded solder from one connection will be misaligned with the extruded solder from the adjacent connections, thereby permitting higher density of connections in the flip chip component.

In a first embodiment, an electronic component includes and electronic device die and a substrate. The electronic device die includes a plurality of first conductive contacts. Each first conductive contact includes a conductive pillar conductively affixed to the first conductive contact. Each conductive pillar includes a first cavity formed in an end of the conductive pillar opposite the first conductive contact. The substrate includes a plurality of second conductive contacts that are each associated with a unique one of the first conductive contacts. Each second conductive contact includes a conductive pad conductively affixed to the associated second conductive contact and has a second cavity formed in a surface of the conductive pad opposite the substrate. Each conductive pad includes a conductive ring situated within the second cavity. The conductive ring has a capillary formed along an axis of the conductive ring.

In a first aspect, the conductive pillar is fabricated of copper. In a second aspect, the conductive pillar has a diameter of less than 3 micrometers. Further, the conductive pillar can have a diameter of 10-100 nanometers. In a third aspect, the conductive pad and the conductive ring are fabricated of nickel. In a fourth aspect, a solder material fills each capillary and each associated first cavity to form a conductive joint between the pillars and the conductive pads. Each conductive ring can include a third cavity formed in an end of the conductive ring opposite the associated conductive pad. The solder material can further fill the cavity formed in the end of the conductive ring.

In a second embodiment, a substrate for an electronic component includes a plurality of first conductive contacts. Each first conductive contact is associated with a second conductive contact of an electronic device die. Each first conductive contact comprises a conducive pad, a solder material, and a conductive ring. The conductive pad is conductively coupled to the first conductive contact and includes a first cavity formed in the conductive pad opposite the substrate. The solder material is formed within the first cavity. The conductive ring is formed atop the solder material and includes a capillary formed along an axis of the conductive ring.

In a first aspect, the conductive pad and the conductive ring are fabricated of nickel. In a second aspect, the conductive pad has a diameter of less than 3 micrometers. The conductive pad can have a diameter of 10-100 nanometers. In a third aspect, when the electronic device die is bonded to the substrate, the solder material is reflowed, and flows through the capillary to form a conductive joint with the associated second conductive contact of the electronic device. Each conductive ring can include a cavity formed in an end of the conductive ring opposite the associated conductive pad. When the electronic device die is bonded to the substrate, the solder material can further fill the cavity formed in the end of the conductive ring.

In a third embodiment, a method includes forming, on a substrate of a flip chip electronic component, a conductive pad on a first conductive contact of the substrate, forming, in an end of the conductive pad opposite the substrate, a first cavity, depositing, in the first cavity, a solder material, forming, within the first cavity and on a surface of the solder material, a conductive ring, the conductive ring including a capillary formed along an axis of the conductive ring, and bonding an electronic device die to the substrate, wherein, when bonding the electronic device to the substrate, the solder material is reflowed and flows through the capillary to form a conductive joint with an associated second conductive contact of the electronic device.

In a first aspect, the conductive pillar has a diameter of less than 3 micrometers. The conductive pad can have a diameter of 10-100 nanometers. In a second aspect, the method further comprises forming, in the end of the conductive ring opposite the conductive pad, a second cavity. The solder material can further fill the second cavity.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An electronic component, comprising:
   an electronic device die including a plurality of first conductive contacts, each first conductive contact including a conductive pillar conductively affixed to the first conductive contact, wherein each conductive pillar includes a first cavity formed in an end of the conductive pillar opposite the first conductive contact; and
   a substrate including a plurality of second conductive contacts, each second conductive contact being associated with a unique one of the first conductive contacts, each second conductive contact including a conductive pad conductively affixed to the associated second conductive contact and having a second cavity formed in a surface of the conductive pad opposite the substrate, and each conductive pad including a conductive ring situated within the second cavity, the conductive ring having a capillary formed along an axis of the conductive ring.

2. The electronic component of claim 1, wherein the conductive pillar is fabricated of copper.

3. The electronic component of claim 1, wherein the conductive pillar has a diameter of less than 3 micrometers.

4. The electronic component of claim 3, wherein the conductive pillar has a diameter of 10-100 nanometers.

5. The electronic component of claim 1, wherein the conductive pad and the conductive ring are fabricated of nickel.

6. The electronic component of claim 1, wherein a solder material fills each capillary and each associated first cavity to form a conductive joint between the pillars and the conductive pads.

7. The electronic component of claim 1 wherein each conductive ring includes a third cavity formed in an end of the conductive ring opposite the associated conductive pad.

8. The electronic component of claim 7, wherein the solder material further fills the cavity formed in the end of the conductive ring.

9. A substrate for an electronic component, the substrate including a plurality of first conductive contacts, each first conductive contact being associated with a second conductive contact of an electronic device die, each first conductive contact comprising:
   a conductive pad conductively coupled to the first conductive contact, the conductive pad including a first cavity formed in the conductive pad opposite the substrate;
   a solder material formed within the first cavity;
   a conductive ring formed atop the solder material, the conductive ring including a capillary formed along an axis of the conductive ring.

10. The substrate of claim 9, wherein the conductive pad and the conductive ring are fabricated of nickel.

11. The substrate of claim 9, wherein the conductive pad has a diameter of less than 3 micrometers.

12. The substrate of claim 11, wherein the conductive pad has a diameter of 10-100 nanometers.

13. The substrate of claim 9, wherein, when the electronic device die is bonded to the substrate, the solder material is reflowed, and flows through the capillary to form a conductive joint with the associated second conductive contact of the electronic device.

14. The substrate of claim 13, wherein each conductive ring includes a cavity formed in an end of the conductive ring opposite the associated conductive pad.

15. The substrate of claim 14, wherein when the electronic device die is bonded to the substrate, the solder material further fills the cavity formed in the end of the conductive ring.

* * * * *